(12) United States Patent
McCune et al.

(10) Patent No.: US 10,605,469 B2
(45) Date of Patent: Mar. 31, 2020

(54) SYSTEM AND METHOD FOR CAPTURE OF WASTE HEAT IN AN HVAC UNIT

(71) Applicant: Johnson Controls Technology Company, Milwaukee, WI (US)

(72) Inventors: Tyler P. McCune, El Dorado, KS (US); Shawn A. Hem, Park City, KS (US); Brian D. Rigg, Douglass, KS (US); Jedidiah O. Bentz, Wichita, KS (US); Aneek M. Noor, Wichita, KS (US); Theresa N. Gillette, Wichita, KS (US); Tom R. Tasker, Andover, KS (US); Shaun B. Atchison, Wichita, KS (US)

(73) Assignee: Johnson Controls Technology Company, Auburn Hills, MI (US)

( * ) Notice: Subject to any disclaimer, the term of this patent is extended or adjusted under 35 U.S.C. 154(b) by 197 days.

(21) Appl. No.: 15/648,328

(22) Filed: Jul. 12, 2017

(65) Prior Publication Data
US 2018/0031253 A1    Feb. 1, 2018

Related U.S. Application Data

(60) Provisional application No. 62/367,364, filed on Jul. 27, 2016.

(51) Int. Cl.
*F24F 5/00* (2006.01)
*H01L 35/30* (2006.01)
(Continued)

(52) U.S. Cl.
CPC .............. *F24F 5/0042* (2013.01); *F24F 1/56* (2013.01); *F25B 6/02* (2013.01); *H01L 35/28* (2013.01); *H01L 35/30* (2013.01)

(58) Field of Classification Search
CPC .......... F24F 5/0042; F24F 1/56; H01L 35/28; H01L 35/30; F25B 6/02
See application file for complete search history.

(56) References Cited

U.S. PATENT DOCUMENTS

| 4,100,763 A | 7/1978 | Brody |
| 4,226,606 A | 10/1980 | Yaeger et al. |

(Continued)

FOREIGN PATENT DOCUMENTS

| CN | 105042748 A | 11/2015 |
| GB | 1518652 A | 7/1978 |

(Continued)

*Primary Examiner* — David J Teitelbaum
(74) *Attorney, Agent, or Firm* — Fletcher Yoder, P.C.

(57) ABSTRACT

In one embodiment of the present disclosure, a heating, ventilating, and air conditioning (HVAC) system includes a refrigerant circuit configured to flow a refrigerant. The refrigerant circuit includes a compressor configured to compress the refrigerant, a condenser configured to receive the refrigerant from the compressor and to condense the refrigerant, a valve configured to receive a first portion of the refrigerant from the condenser and to decrease a pressure of the first portion of the refrigerant, and an evaporator configured to receive the first portion of the refrigerant from the condenser and configured to evaporate the first portion of the refrigerant. The refrigerant circuit also includes a refrigerant sub-circuit configured to receive a second portion of the refrigerant from the condenser and to convert thermal energy of the second portion of the refrigerant to electrical energy.

24 Claims, 6 Drawing Sheets

(51) Int. Cl.
   *F24F 1/56*    (2011.01)
   *F25B 6/02*    (2006.01)
   *H01L 35/28*   (2006.01)

(56) References Cited

U.S. PATENT DOCUMENTS

| | | | |
|---|---|---|---|
| 6,405,543 B2 | 6/2002 | Kopko | |
| 2007/0101737 A1* | 5/2007 | Akei | F25B 1/00 |
| | | | 62/238.6 |
| 2007/0295018 A1 | 12/2007 | Williams | |
| 2009/0044554 A1* | 2/2009 | Takeichi | F24F 1/26 |
| | | | 62/259.1 |
| 2010/0122540 A1* | 5/2010 | Taras | F25B 25/00 |
| | | | 62/3.2 |
| 2011/0005254 A1 | 1/2011 | Lin | |
| 2012/0169067 A1* | 7/2012 | Ruan | F24H 4/06 |
| | | | 290/1 R |
| 2013/0186122 A1 | 7/2013 | Hamilton | |
| 2014/0000668 A1* | 1/2014 | Lessard | H01L 35/30 |
| | | | 136/201 |
| 2017/0020305 A1 | 1/2017 | Fischer | |

FOREIGN PATENT DOCUMENTS

| | | |
|---|---|---|
| KR | 20060069704 A | 6/2006 |
| WO | 2008072929 A2 | 6/2008 |

\* cited by examiner

SYSTEM AND METHOD FOR CAPTURE OF WASTE HEAT IN AN HVAC UNIT

CROSS REFERENCE TO RELATED APPLICATIONS

This application is a Non-Provisional application claiming priority to U.S. Provisional Application No. 62/367,364, entitled "CAPTURE OF WASTE HEAT ON HVAC UNIT," filed Jul. 27, 2016, which is hereby incorporated by reference in its entirety for all purposes.

BACKGROUND

The present disclosure relates generally to heating, ventilating, and air conditioning (HVAC) systems and, more particularly, to the systems and methods for capturing waste heat in HVAC systems.

A wide range of applications exists for HVAC systems. For example, residential, light commercial, commercial, and industrial systems are used to control temperatures and air quality in indoor environments and buildings. Generally, HVAC systems may circulate a fluid, such as a refrigerant, through a closed loop between an evaporator where the fluid absorbs heat and a condenser where the fluid releases heat. The fluid flowing within the closed loop is generally formulated to undergo phase changes within the normal operating temperatures and pressures of the system so that quantities of heat can be exchanged by virtue of the latent heat of vaporization of the fluid.

While heat is exchanged within the closed loop of HVAC units, and more specifically, within a condenser heat exchanger of the closed loop, waste heat may be expelled to the atmosphere in the form of heated air. This heated air may essentially be wasted and unutilized thermal energy.

SUMMARY

In one embodiment of the present disclosure, a heating, ventilating, and air conditioning (HVAC) system includes a refrigerant circuit configured to flow a refrigerant. The refrigerant circuit includes a compressor configured to compress the refrigerant, a condenser configured to receive the refrigerant from the compressor and to condense the refrigerant, a valve configured to receive a first portion of the refrigerant from the condenser and to decrease a pressure of the first portion of the refrigerant, and an evaporator configured to receive the first portion of the refrigerant from the condenser and configured to evaporate the first portion of the refrigerant. The refrigerant circuit also includes a refrigerant sub-circuit configured to receive a second portion of the refrigerant from the condenser and to convert thermal energy of the second portion of the refrigerant to electrical energy.

In another embodiment of the present disclosure, a heating, ventilating, and air conditioning (HVAC) system includes an outdoor unit configured to receive refrigerant from an indoor unit. The outdoor unit includes a compressor configured to receive the refrigerant and increase a pressure of the refrigerant, and a condenser configured to receive the refrigerant from the compressor and to condense the refrigerant. A first portion of the refrigerant is routed from the condenser to the indoor unit. The outdoor unit also includes a sub-circuit heat exchanger configured to receive a second portion of the refrigerant from the condenser. The sub-circuit heat exchanger is disposed between a fan and a fan guard of the outdoor unit.

In a further embodiment of the present disclosure, a method of capturing heat in a heating, ventilating, and air conditioning (HVAC) system includes dividing a refrigerant flow exiting a condenser into a first portion and a second portion and flowing the first portion of refrigerant through a first refrigerant circuit. The first refrigerant circuit comprises a compressor, the condenser, a first valve, and an evaporator. The method also includes flowing the second portion of refrigerant through a second refrigerant circuit. The second refrigerant circuit comprises the compressor, the condenser, a second valve, a sub-circuit heat exchanger, and a thermoelectric module. The method further includes converting thermal energy of the second portion of refrigerant into electrical energy with the thermoelectric module.

Other features and advantages of the present application will be apparent from the following, more detailed description of the embodiments, taken in conjunction with the accompanying drawings, which illustrate, by way of example, the principles of the application.

DETAILED DESCRIPTION

The present disclosure is directed to heating, ventilating, and air conditioning (HVAC) systems that are configured to capture waste heat. For example, in an HVAC system a condenser may expel waste heat to the atmosphere in the form of heated air. The embodiments discussed herein provide a refrigerant sub-circuit to capture and utilize at least some of the expelled waste heat. The refrigerant sub-circuit may include, among other elements, a sub-circuit heat exchanger and a thermal electric generator. The sub-circuit heat exchanger may generally be positioned at the top of the condenser, between a condenser fan and a fan guard. The sub-circuit heat exchanger may function similar to an evaporator heat exchanger in that it may transfer heat from the expelled waste heat to heat (e.g., vaporize) a refrigerant flowing through the sub-circuit heat exchanger. The heated refrigerant may then be routed to a thermoelectric generator which may convert some thermal energy of the refrigerant to electrical energy. The heated refrigerant may also be routed to a main refrigerant circuit of the HVAC system. In this manner, the HVAC system may function more efficiently and, in some embodiments, produce additional electrical energy. Further, due to an increase in efficiency of the HVAC system, less electrical energy may be utilized by the HVAC system.

Figure 1:
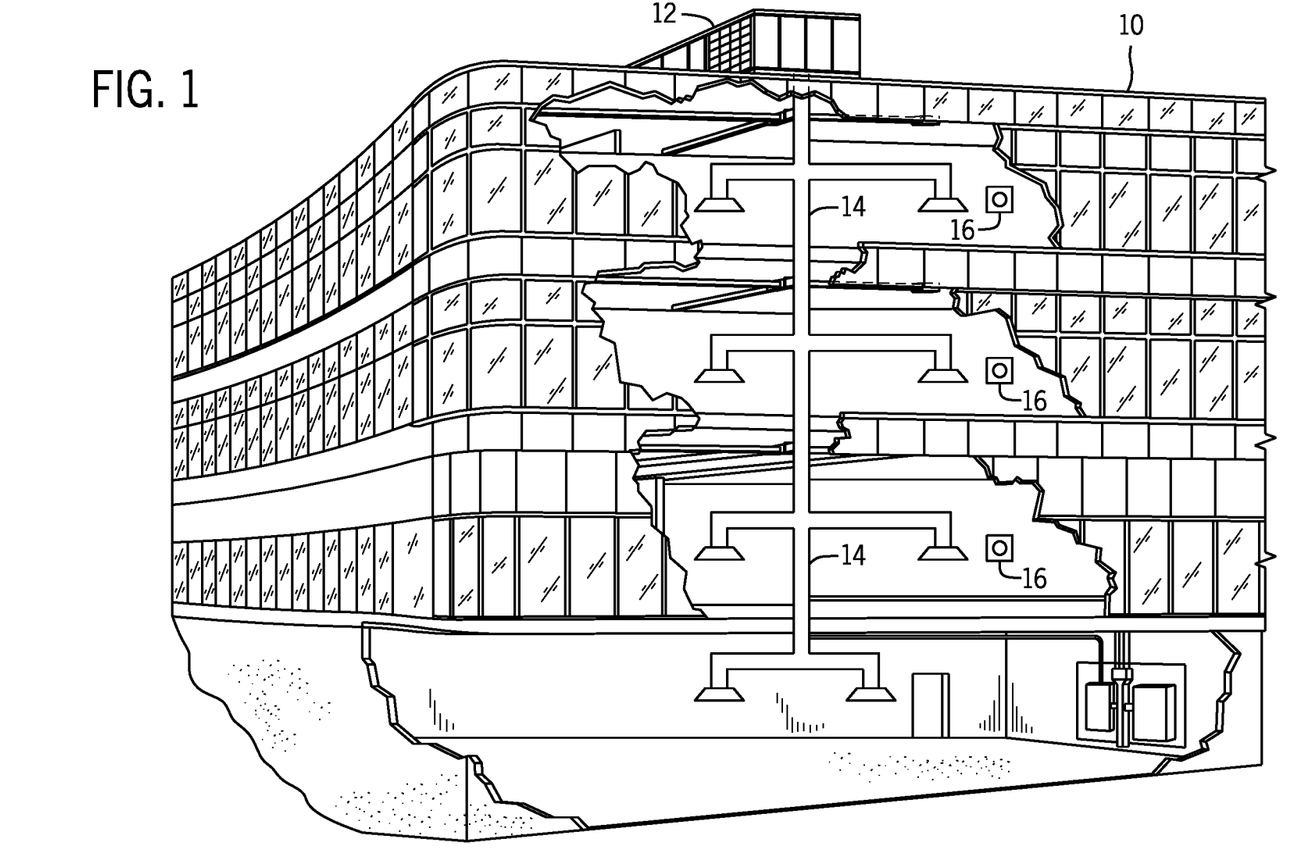
FIG. 1 is a perspective view of a heating, ventilating, and air conditioning (HVAC) system for building environmental management that may employ one or more HVAC units, in accordance with an embodiment of the present disclosure.

Turning now to the drawings, FIG. 1 illustrates a heating, ventilating, and air conditioning (HVAC) system for building environmental management that may employ one or more HVAC units. In the illustrated embodiment, a building 10 is air conditioned by a system that includes an HVAC unit 12. The building 10 may be a commercial structure or a residential structure. As shown, the HVAC unit 12 is disposed on the roof of the building 10; however, the HVAC unit 12 may be located in other equipment rooms or areas adjacent the building 10. The HVAC unit 12 may be a single package unit containing other equipment, such as a blower, integrated air handler, and/or auxiliary heating unit. In other embodiments, the HVAC unit 12 may be part of a split HVAC system, such as the system shown in FIG. 3, which includes an outdoor HVAC unit 58 and an indoor HVAC unit 56.

The HVAC unit 12 is an air cooled device that implements a refrigerant cycle to provide conditioned air to the building 10. Specifically, the HVAC unit 12 may include one or more heat exchangers across which an air flow is passed to condition the air flow before the air flow is supplied to the building. In the illustrated embodiment, the HVAC unit 12 is a rooftop unit (RTU) that conditions a supply air stream, such as environmental air and/or a return air flow from the building 10. After the HVAC unit 12 conditions the air, the air is supplied to the building 10 via ductwork 14 extending throughout the building 10 from the HVAC unit 12. For example, the ductwork 14 may extend to various individual floors or other sections of the building 10. In certain embodiments, the HVAC unit 12 may be a heat pump that provides both heating and cooling to the building with one refrigerant circuit configured to operate in different modes. In other embodiments, the HVAC unit 12 may include one or more refrigerant circuits for cooling an air stream and a furnace for heating the air stream.

A control device 16, one type of which may be a thermostat, may be used to designate the temperature of the conditioned air. The control device 16 also may be used to control the flow of air through the ductwork 14. For example, the control device 16 may be used to regulate operation of one or more components of the HVAC unit 12 or other components, such as dampers and fans, within the building 10 that may control flow of air through and/or from the ductwork 14. In some embodiments, other devices may be included in the system, such as pressure and/or temperature transducers or switches that sense the temperatures and pressures of the supply air, return air, and so forth. Moreover, the control device 16 may include computer systems that are integrated with or separate from other building control or monitoring systems, and even systems that are remote from the building 10.

Figure 2:
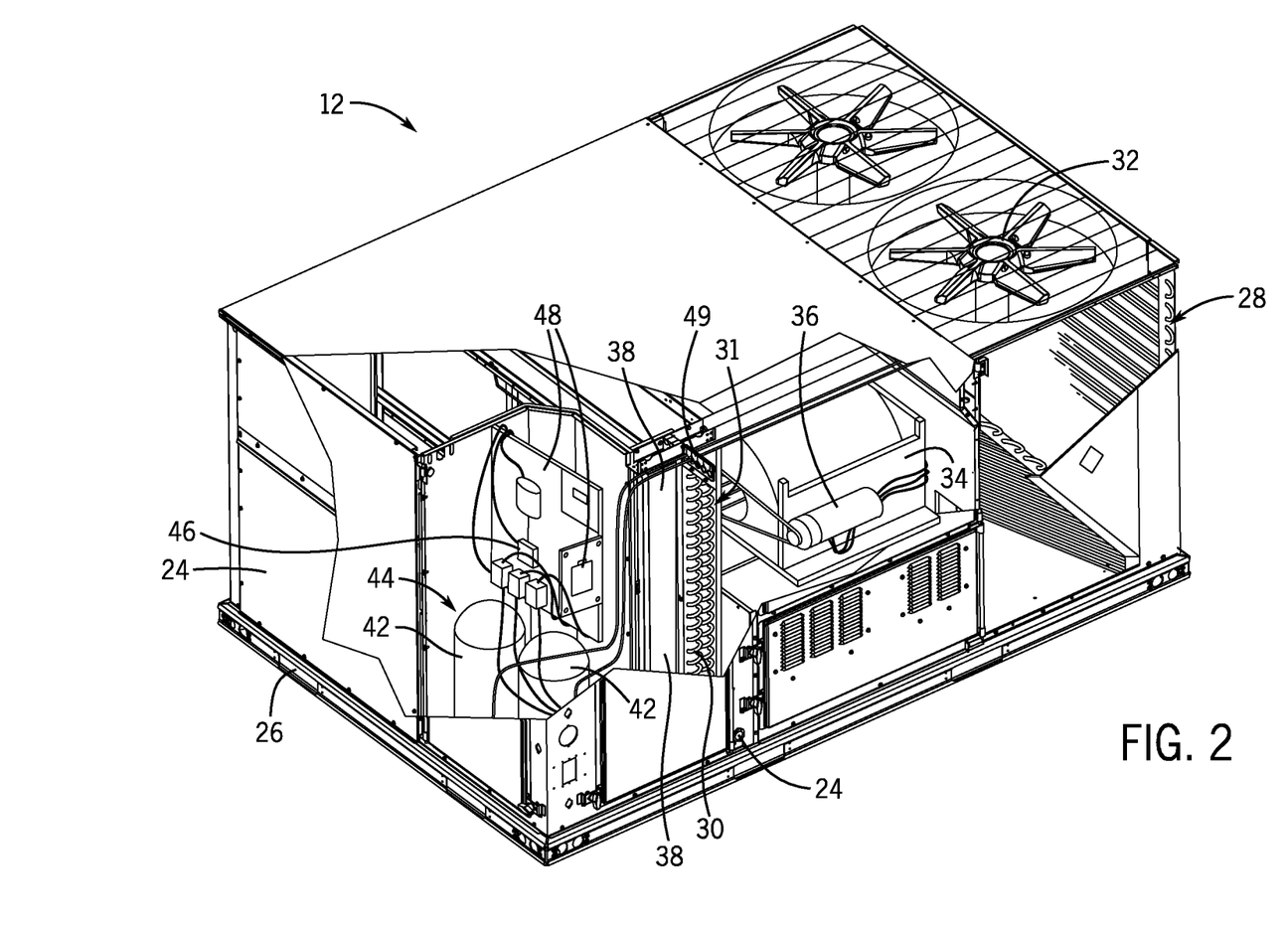
FIG. 2 is a perspective view of an HVAC unit of the HVAC system of FIG. 1, in accordance with an embodiment of the present disclosure.

FIG. 2 is a perspective view of an embodiment of the HVAC unit 12. In the illustrated embodiment, the HVAC unit 12 is a single package unit that may include one or more independent refrigerant circuits and components that are tested, charged, wired, piped, and ready for installation. The HVAC unit 12 may provide a variety of heating and/or cooling functions, such as cooling only, heating only, cooling with electric heat, cooling with dehumidification, cooling with gas heat, or cooling with a heat pump. As described above, the HVAC unit 12 may directly cool and/or heat an air stream provided to the building 10 to condition a space in the building 10.

As shown in the illustrated embodiment of FIG. 2, a cabinet 24 encloses the HVAC unit 12 and provides structural support and protection to the internal components from environmental and other contaminants. In some embodiments, the cabinet 24 may be constructed of galvanized steel and insulated with aluminum foil faced insulation. Rails 26 may be joined to the bottom perimeter of the cabinet 24 and provide a foundation for the HVAC unit 12. In certain embodiments, the rails 26 may provide access for a forklift and/or overhead rigging to facilitate installation and/or removal of the HVAC unit 12. In some embodiments, the rails 26 may fit into "curbs" on the roof to enable the HVAC unit 12 to provide air to the ductwork 14 from the bottom of the HVAC unit 12 while blocking elements such as rain from leaking into the building 10.

The HVAC unit 12 includes heat exchangers 28 and 30 in fluid communication with one or more refrigerant circuits. Tubes within the heat exchangers 28 and 30 may circulate refrigerant (for example, R-410A, steam, or water) through the heat exchangers 28 and 30. The tubes may be of various types, such as multichannel tubes, conventional copper or aluminum tubing, and so forth. Together, the heat exchangers 28 and 30 may implement a thermal cycle in which the refrigerant undergoes phase changes and/or temperature changes as it flows through the heat exchangers 28 and 30 to produce heated and/or cooled air. For example, the heat exchanger 28 may function as a condenser where heat is released from the refrigerant to ambient air, and the heat exchanger 30 may function as an evaporator where the refrigerant absorbs heat to cool an air stream. In other embodiments, the HVAC unit 12 may operate in a heat pump mode where the roles of the heat exchangers 28 and 30 may be reversed. That is, the heat exchanger 28 may function as an evaporator and the heat exchanger 30 may function as a condenser. In further embodiments, the HVAC unit 12 may include a furnace for heating the air stream that is supplied to the building 10. While the illustrated embodiment of FIG. 2 shows the HVAC unit 12 having two of the heat exchangers 28 and 30, in other embodiments, the HVAC unit 12 may include one heat exchanger or more than two heat exchangers.

The heat exchanger 30 is located within a compartment 31 that separates the heat exchanger 30 from the heat exchanger 28. Fans 32 draw air from the environment through the heat exchanger 28. Air may be heated and/or cooled as the air flows through the heat exchanger 28 before being released back to the environment surrounding the rooftop unit 12. A blower assembly 34, powered by a motor 36, draws air through the heat exchanger 30 to heat or cool the air. The heated or cooled air may be directed to the building 10 by the ductwork 14, which may be connected to the HVAC unit 12. Before flowing through the heat exchanger 30, the conditioned air flows through one or more filters 38 that may remove particulates and contaminants from the air. In certain embodiments, the filters 38 may be disposed on the air intake side of the heat exchanger 30 to prevent contaminants from contacting the heat exchanger 30.

The HVAC unit 12 also may include other equipment for implementing the thermal cycle. Compressors 42 increase the pressure and temperature of the refrigerant before the refrigerant enters the heat exchanger 28. The compressors 42 may be any suitable type of compressors, such as scroll compressors, rotary compressors, screw compressors, or reciprocating compressors. In some embodiments, the compressors 42 may include a pair of hermetic direct drive compressors arranged in a dual stage configuration 44. However, in other embodiments, any number of the compressors 42 may be provided to achieve various stages of heating and/or cooling. As may be appreciated, additional equipment and devices may be included in the HVAC unit 12, such as a solid-core filter drier, a drain pan, a disconnect switch, an economizer, pressure switches, phase monitors, and humidity sensors, among other things.

The HVAC unit 12 may receive power through a terminal block 46. For example, a high voltage power source may be connected to the terminal block 46 to power the equipment. The operation of the HVAC unit 12 may be governed or regulated by a control board 48. The control board 48 may include control circuitry connected to a thermostat, sensors, and alarms (one or more being referred to herein separately or collectively as the control device 16). The control circuitry may be configured to control operation of the equipment, provide alarms, and monitor safety switches. Wiring 49 may connect the control board 48 and the terminal block 46 to the equipment of the HVAC unit 12.

Figure 3:
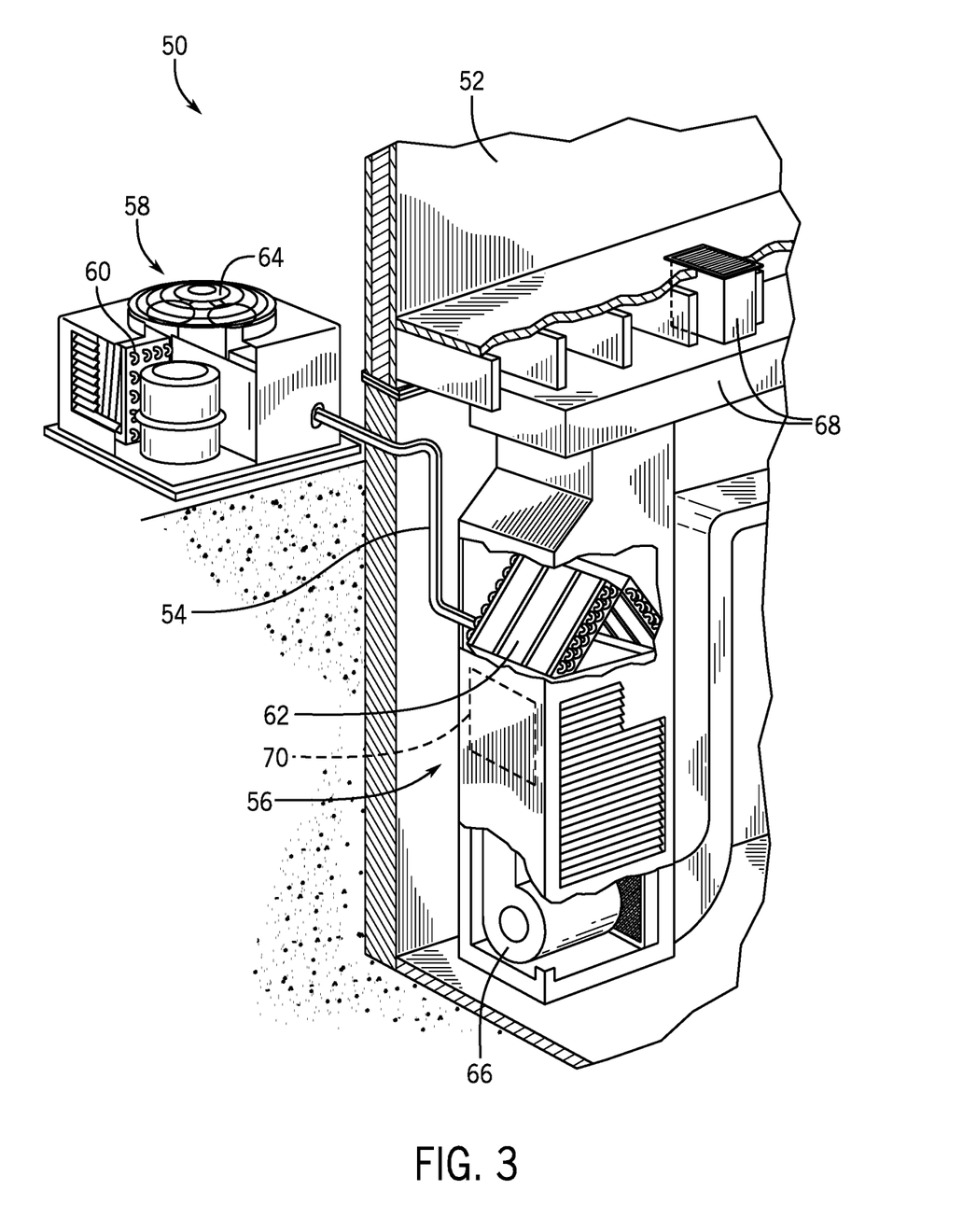
FIG. 3 is a perspective view of a residential heating and cooling system of the HVAC system of FIG. 1, in accordance with an embodiment of the present disclosure.

FIG. 3 illustrates a residential heating and cooling system 50, also in accordance with present techniques. The residential heating and cooling system 50 may provide heated and cooled air to a residential structure, as well as provide outside air for ventilation and provide improved indoor air quality (IAQ) through devices such as ultraviolet lights and air filters. In the illustrated embodiment, the residential heating and cooling system 50 is a split HVAC system. In general, a residence 52 conditioned by a split HVAC system may include refrigerant conduits 54 that operatively couple the indoor unit 56 to the outdoor unit 58. The indoor unit 56 may be positioned in a utility room, an attic, a basement, and so forth. The outdoor unit 58 is typically situated adjacent to a side of residence 52 and is covered by a shroud to protect the system components and to prevent leaves and other debris or contaminants from entering the unit. The refrigerant conduits 54 transfer refrigerant between the indoor unit 56 and the outdoor unit 58, typically transferring primarily liquid refrigerant in one direction and primarily vaporized refrigerant in an opposite direction.

When the system shown in FIG. 3 is operating as an air conditioner, a heat exchanger 60 in the outdoor unit 58 serves as a condenser for re-condensing vaporized refrigerant flowing from the indoor unit 56 to the outdoor unit 58 via one of the refrigerant conduits 54. In these applications, a heat exchanger 62 of the indoor unit functions as an evaporator. Specifically, the heat exchanger 62 receives liquid refrigerant (which may be expanded by an expansion device, not shown) and evaporates the refrigerant before returning it to the outdoor unit 58.

The outdoor unit 58 draws environmental air through the heat exchanger 60 using a fan 64 and expels the air above the outdoor unit 58. When operating as an air conditioner, the air is heated by the heat exchanger 60 within the outdoor unit 58 and exits the unit at a temperature higher than it entered. The indoor unit 56 includes a blower or fan 66 that directs air through or across the indoor heat exchanger 62, where the air is cooled when the system is operating in air conditioning mode. Thereafter, the air is passed through ductwork 68 that directs the air to the residence 52. The overall system operates to maintain a desired temperature as set by a system controller. When the temperature sensed inside the residence 52 is higher than the set point on the thermostat (plus a small amount), the residential heating and cooling system 50 may become operative to refrigerate additional air for circulation through the residence 52. When the temperature reaches the set point (minus a small amount), the residential heating and cooling system 50 may stop the refrigerant cycle temporarily.

The residential heating and cooling system 50 may also operate as a heat pump. When operating as a heat pump, the roles of heat exchangers 60 and 62 are reversed. That is, the heat exchanger 60 of the outdoor unit 58 will serve as an evaporator to evaporate refrigerant and thereby cool air entering the outdoor unit 58 as the air passes over outdoor the heat exchanger 60. The indoor heat exchanger 62 will receive a stream of air blown over it and will heat the air by condensing the refrigerant.

In some embodiments, the indoor unit 56 may include a furnace system 70. For example, the indoor unit 56 may include the furnace system 70 when the residential heating and cooling system 50 is not configured to operate as a heat pump. The furnace system 70 may include a burner assembly and heat exchanger, among other components, inside the indoor unit 56. Fuel is provided to the burner assembly of the furnace 70 where it is mixed with air and combusted to form combustion products. The combustion products may pass through tubes or piping in a heat exchanger (that is, separate from heat exchanger 62), such that air directed by the blower 66 passes over the tubes or pipes and extracts heat from the combustion products. The heated air may then be routed from the furnace system 70 to the ductwork 68 for heating the residence 52.

Figure 4:
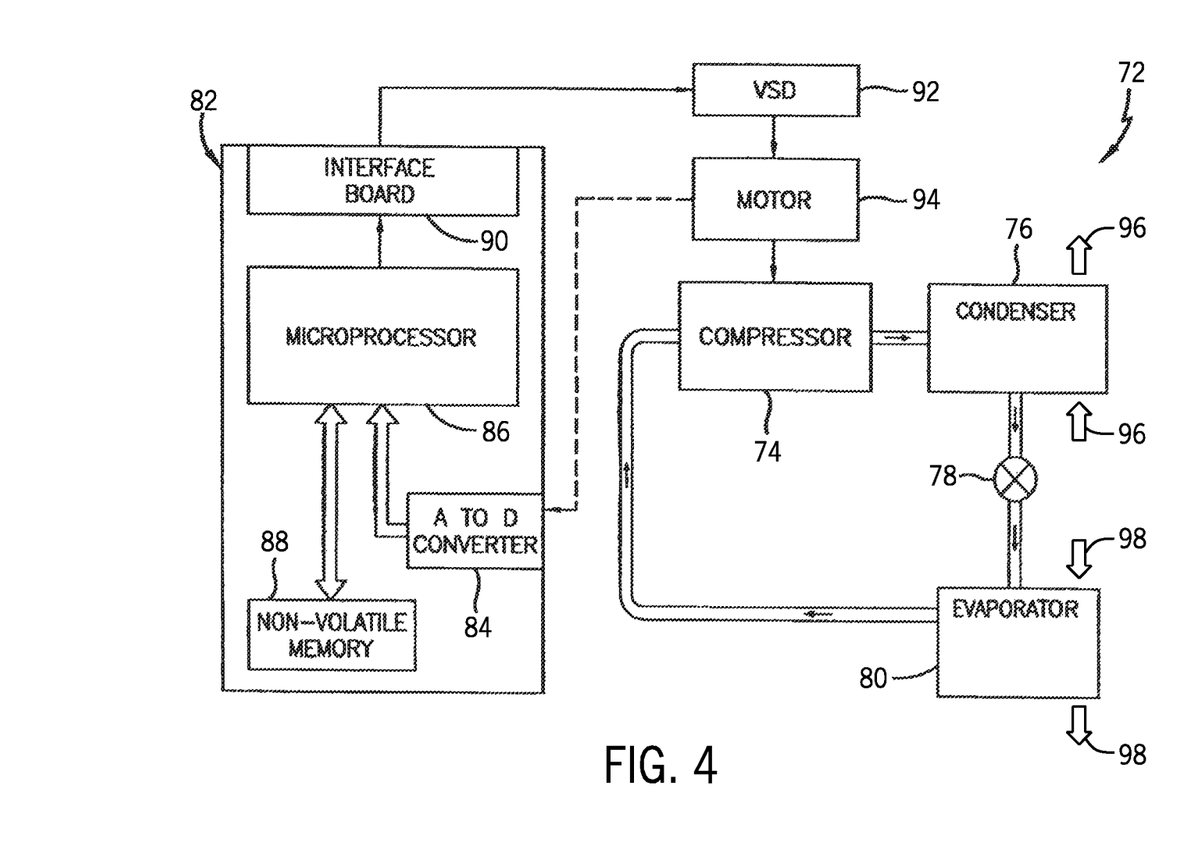
FIG. 4 is a schematic of a vapor compression system that may be used in the HVAC system of FIG. 1, in accordance with an embodiment of the present disclosure.

FIG. 4 is an embodiment of a vapor compression system 72 that can be used in any of the systems described above. The vapor compression system 72 may circulate a refrigerant through a circuit starting with a compressor 74. The circuit may also include a condenser 76, an expansion valve(s) or device(s) 78, and an evaporator 80. The vapor compression system 72 may further include a control panel 82 that has an analog to digital (A/D) converter 84, a microprocessor 86, a non-volatile memory 88, and/or an interface board 90. The control panel 82 and its components may function to regulate operation of the vapor compression system 72 based on feedback from an operator, from sensors of the vapor compression system 72 that detect operating conditions, and so forth.

In some embodiments, the vapor compression system 72 may use one or more of a variable speed drive (VSDs) 92, a motor 94, the compressor 74, the condenser 76, the expansion valve or device 78, and/or the evaporator 80. The motor 94 may drive the compressor 74 and may be powered by the variable speed drive (VSD) 92. The VSD 92 receives alternating current (AC) power having a particular fixed line voltage and fixed line frequency from an AC power source, and provides power having a variable voltage and frequency to the motor 94. In other embodiments, the motor 94 may be powered directly from an AC or direct current (DC) power source. The motor 94 may include any type of electric motor that can be powered by a VSD or directly from an AC or DC power source, such as a switched reluctance motor, an induction motor, an electronically commutated permanent magnet motor, or another suitable motor.

The compressor 74 compresses a refrigerant vapor and delivers the vapor to the condenser 76 through a discharge passage. In some embodiments, the compressor 74 may be a centrifugal compressor. The refrigerant vapor delivered by the compressor 74 to the condenser 76 may transfer heat to a fluid passing across the condenser 76, such as ambient or environmental air 96. The refrigerant vapor may condense to a refrigerant liquid in the condenser 76 as a result of thermal heat transfer with the environmental air 96. The liquid refrigerant from the condenser 76 may flow through the expansion device 78 to the evaporator 80.

The liquid refrigerant delivered to the evaporator 80 may absorb heat from another air stream, such as a supply air stream 98 provided to the building 10 or the residence 52. For example, the supply air stream 98 may include ambient or environmental air, return air from a building, or a combination of the two. The liquid refrigerant in the evaporator 80 may undergo a phase change from the liquid refrigerant to a refrigerant vapor. In this manner, the evaporator 38 may reduce the temperature of the supply air stream 98 via thermal heat transfer with the refrigerant. Thereafter, the vapor refrigerant exits the evaporator 80 and returns to the compressor 74 by a suction line to complete the cycle.

In some embodiments, the vapor compression system 72 may further include a reheat coil in addition to the evaporator 80. For example, the reheat coil may be positioned downstream of the evaporator relative to the supply air stream 98 and may reheat the supply air stream 98 when the supply air stream 98 is overcooled to remove humidity from the supply air stream 98 before the supply air stream 98 is directed to the building 10 or the residence 52.

It should be appreciated that any of the features described herein may be incorporated with the HVAC unit 12, the residential heating and cooling system 50, or other HVAC systems. Additionally, while the features disclosed herein are described in the context of embodiments that directly heat and cool a supply air stream provided to a building or other load, embodiments of the present disclosure may be applicable to other HVAC systems as well. For example, the features described herein may be applied to mechanical cooling systems, free cooling systems, chiller systems, or other heat pump or refrigeration applications.

As discussed in detail below, waste heat from the HVAC system 12, the residential heating and cooling system 50, and/or the vapor compression system 72 may be captured and utilized through a sub-circuit refrigerant loop. More particularly, waste heat from the heat exchangers 28, the heat exchanger 60, and/or the condenser 76 may be captured to heat refrigerant flowing through the sub-circuit refrigerant loop.

Figure 5:
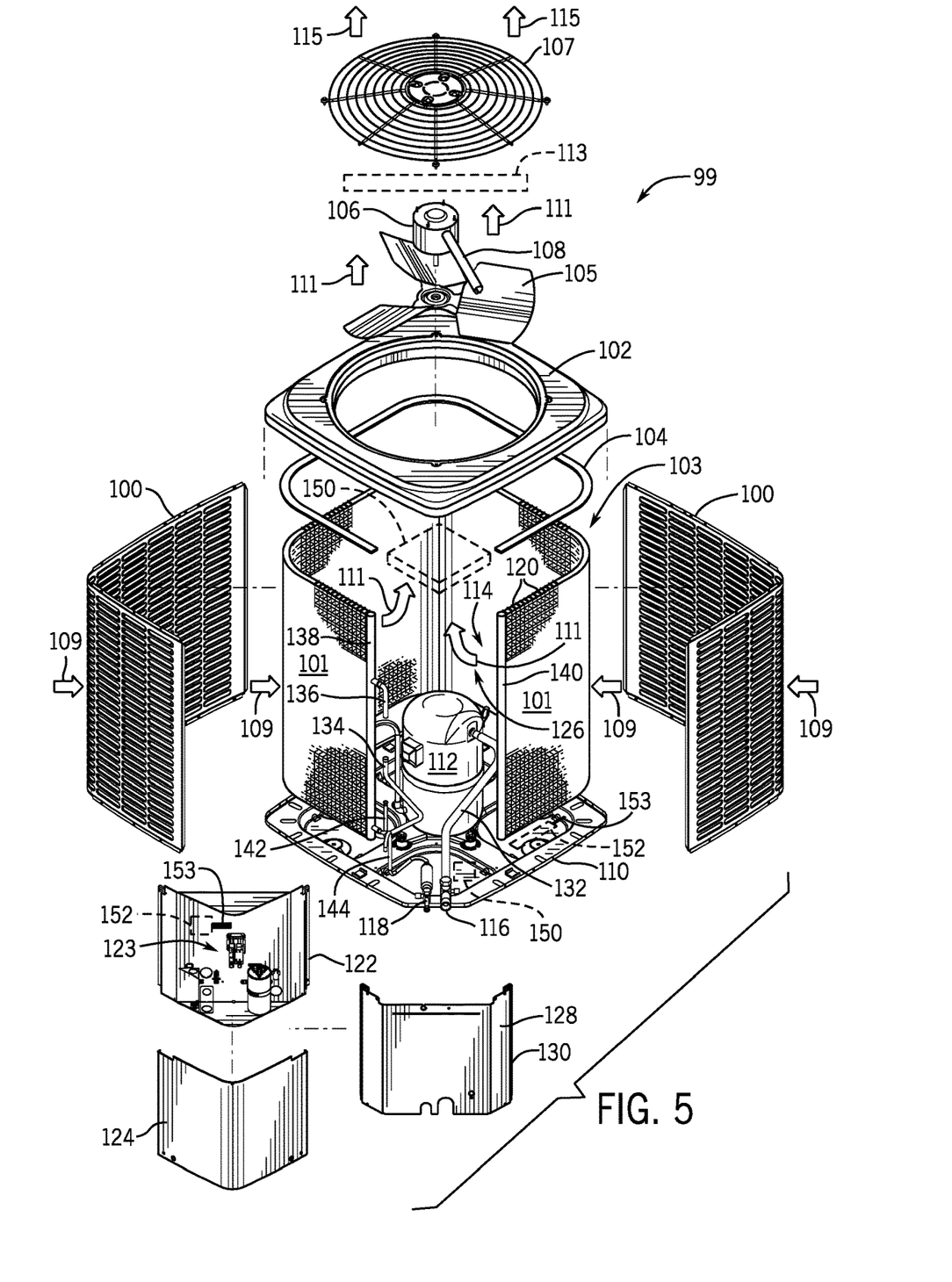
FIG. 5 is an exploded perspective view of an outdoor unit of the HVAC system of FIG. 1 having a sub-circuit heat exchanger, in accordance with an embodiment of the present disclosure.

Keeping this in mind, FIG. 5 illustrates a partially exploded view of an embodiment of an outdoor unit 99, which may be an embodiment of the outdoor unit 58 as shown in FIG. 3. As shown in the illustrated embodiment and mentioned above, the outdoor unit 99 includes a shroud 100. The shroud 100 may have two or more pieces configured to surround the sides of the outdoor unit 99 and to protect system components from dirt, rain, leaves, and/or other contaminants (e.g., environmental elements). A heat exchanger 103 (which may be an embodiment of the heat exchanger 60) of the outdoor unit 99 may include heat exchanger coils 101, which may be positioned adjacent to the shroud 100. A cover 102 encloses a top portion of the heat exchanger coils 101. A barrier 104, such as a foam barrier, may be disposed between the cover 102 and the heat exchanger coils 101 to block air flow in a void between the cover 102 and the heat exchanger coils 101. A fan 105 (which may be an embodiment of the fan 64) is located within an opening of the cover 102 and is powered by a motor 106. A wire way 108 may be used to connect the motor 106 to a power source to power the fan 105. Additionally, in some embodiments, the wire way 108 may also lead to a fan controller that may be configured to selectively supply power to the motor 106 according to input from a control device (e.g., control device 16), and thereby adjust a speed of the fan 105. Accordingly, the fan 105 may rotate at a speed predetermined by the fan controller, and the speed may be based on the amount of power supplied to the motor 106. A fan guard 107 may be disposed within the cover 102 and above the fan 105 to block objects (e.g., contaminants) from entering and/or contacting the fan 105.

While the fan 105 rotates, the fan 105 draws in cool external air 109 through gaps in the shroud 100 and across the heat exchanger coils 101 of the heat exchanger 103. In this manner, refrigerant flowing through the heat exchanger coils 101 may transfer some heat to the cool external air 109, thereby producing heated air 111. The fan 105 further draws the heated air 111 up through the top of the outdoor unit 99 and through a sub-circuit heat exchanger 113. The sub-circuit heat exchanger 113 may be disposed between the fan 105 and the fan guard 107. In some embodiments, tubing, such as copper tubing, of the sub-circuit heat exchanger 113 may be coupled (e.g., clipped, bolted) to a bottom side of the fan guard 107. As such, the sub-circuit heat exchanger 113 may be disposed between the motor 106 of the fan 105 and the fan guard 107. In some embodiments, the sub-circuit heat exchanger 113 may function similarly to the evaporator 80 as discussed above in FIG. 4. For example, while the heated air 111 is pushed through the sub-circuit heat exchanger 113, the heated air 111 exchanges heat with refrigerant running through the sub-circuit heat exchanger 113. Accordingly, refrigerant within the sub-circuit heat exchanger 113 may at least partially change from a liquid to a vapor phase before exiting the sub-circuit heat exchanger 113. As the sub-circuit heat exchanger 113 absorbs heat from the heated air 111, cooled air 115 is produced and pushed by the fan 105 through the fan guard 107 and into the surrounding environment.

In certain embodiments, the heat exchanger coils 101 are mounted on a base pan 110. The base pan 110 provides a mounting surface and structure for the internal components of the outdoor unit 99. A compressor 112 is disposed within the center of the outdoor unit 99 in an inner chamber 114 defined by the heat exchanger coils 101 and may be connected to another unit within the residential heating and cooling system 50, for example the indoor unit HVAC unit 56, by connections 116 and 118 (e.g., refrigerant conduits 54). As shown in the illustrated embodiment of FIG. 5, the inner chamber 114 is formed by a structure of the heat exchanger coils 101 such that air flowing through the inner chamber 114 is in a heat exchanger relationship with fluid flowing through tubing 120 of the heat exchanger coils 101.

Additionally, a control box 122 of the outdoor unit 99 houses a controller 123 (e.g., control circuitry) for the outdoor unit 99 and is protected by a cover 124. In some embodiments, the control box 122 may pivot such that it exposes an opening 126 of the heat exchanger coils 101. In this manner, the compressor 112 and other components located in the inner chamber 114 of the heat exchanger coils 101 may be accessible for maintenance. In certain embodiments, a panel 128 may be used to mount the control box 122 to the outdoor unit 99. For example, the panel 128 may be mounted to the heat exchanger coils 101 (e.g., using mounting brackets) and/or to the base pan 110. The control box 122 may be coupled to at least a first edge 130 of the panel 128 such that the control box 122 may pivot about the first edge 130, thereby exposing the opening 126 in the heat exchanger coils 101, such that the inner chamber 114 may be accessed.

Vaporous refrigerant enters the outdoor unit 99 through the connection 116 and flows through a conduit 132 into the compressor 112. In certain embodiments, the vaporous refrigerant may be received from the indoor unit 56 (not shown). After undergoing compression in the compressor 112, the refrigerant exits the compressor 112 through a conduit 134 and enters the heat exchanger 103 through inlet 136. The inlet 136 directs the refrigerant into a first header 138 or first manifold). From the first header 138, the refrigerant flows through the heat exchanger 103 to a second header 140 or second manifold. From the second header 140, the refrigerant flows back through the heat exchanger 103 and exits through an outlet 142 disposed on the first header 138. After exiting the heat exchanger 103, the refrigerant flows through conduit 144 to connection 118 to return to the indoor unit 56, for example, where the process may begin again. It should be noted that, while the illustrated embodiment of FIG. 5 shows the inlet 136 and the outlet 142 located on the first header 138, the inlet 136 and/or the outlet 142 may be positioned on the second header 140.

In some embodiments, a portion of the refrigerant exiting the heat exchanger 103 through conduit 144 may be routed to the sub-circuit heat exchanger 113 to exchange heat with the heated air 111, as described above. After exiting the sub-circuit heat exchanger 113, the (heated) refrigerant may be routed to a thermoelectric module 150, such as a thermoelectric generator, which may flow the refrigerant through copper coils. The thermoelectric module 150 may convert a portion of the thermal energy from the (heated) refrigerant to electrical energy. In some embodiments, this electric energy may be routed to a storage unit 152, such as a capacitor bank or battery, which stores the electrical energy for use elsewhere within the system (e.g., the HVAC unit 12, the residential heating and cooling system 50, and/or the vapor compression system 72). For example, in some embodiments, electrical energy that the thermoelectric module 150 produces through interaction with the (heated) refrigerant may be utilized to power one or more various elements, such as the fan 105, the compressor 112, one or more valves, the controller 123, and the like. The thermoelectric module 150 may be located underneath and/or adjacent the cover 102 and/or on the base pan 110. Further, the storage unit 152 may be located in a water-shielded area. For example, the storage unit 152 may be located within the control box 122 and/or near the base pan 110, etc. Further, wires 153 couple the storage unit 152 elements of the outside unit 99 (e.g., the controller 123, the thermoelectric module 150). The wires 153 may also be housed in a water-shielded area.

Figure 6:
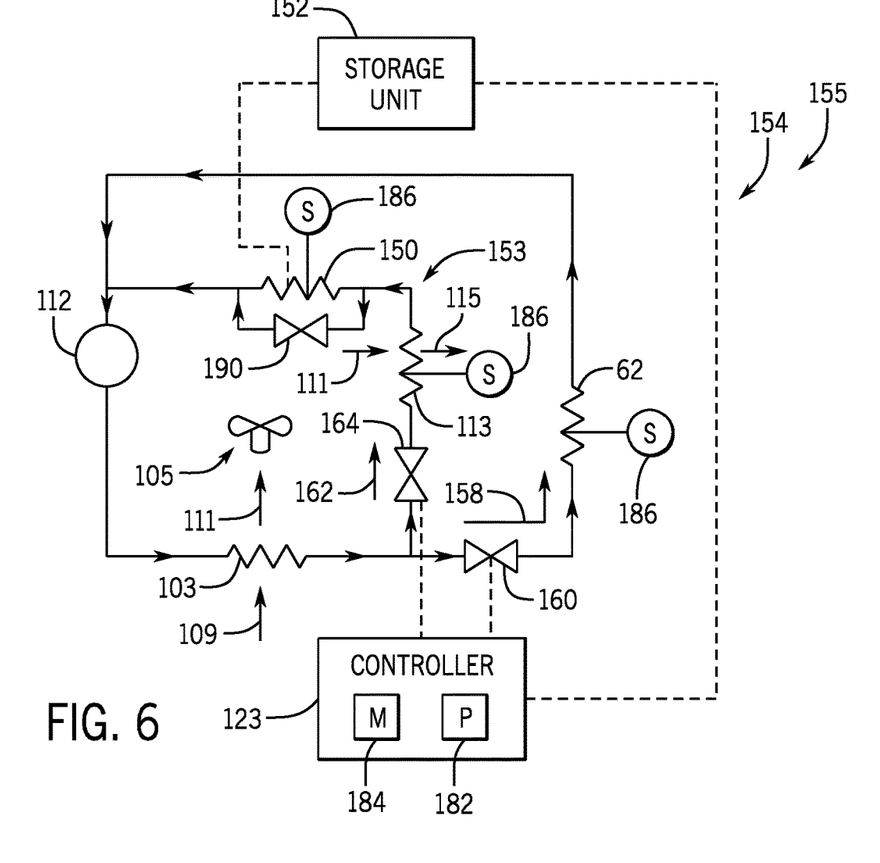
FIG. 6 is a schematic view of a refrigerant loop of the HVAC system of FIG. 1 having a sub-circuit refrigerant loop, in accordance with an embodiment of the present disclosure.

As seen in FIG. 6, the sub-circuit heat exchanger 113 and the thermoelectric module 150 may be part of a sub-circuit refrigerant loop 153 or sub-circuit of a refrigerant loop 154 or sub-circuit, which may all be part of a refrigerant system 155. First, it should be noted that, while elements as shown in FIG. 6 are discussed with respect to the refrigerant system 155, the refrigerant system 155 may be may be utilized within any of the systems discussed above, including the outdoor unit 99, the residential heating and cooling system 50, the HVAC unit 12, and/or the vapor compression system 72. For example, in some embodiments, the heat exchanger 62 may be replaced by the heat exchanger 30 of the HVAC unit 12 or the evaporator 80 of vapor compression system 72. Similarly, in some embodiments, the heat exchanger 103 may be replaced by the heat exchanger 60 of the residential heating and cooling system 50, the heat exchanger 28 of the HVAC unit 12, and/or the condenser of 76 of the vapor compression system 72.

As described above and illustrated in FIG. 6, the heat exchanger 103, such as a condenser heat exchanger, receives a compressed vapor refrigerant from the compressor 112. At the same time, the fan 105 draws external air 109 across the heat exchanger 103. In this manner, the refrigerant exchanges heat with the external air 109 as it flows through the heat exchanger 103, thereby condensing the refrigerant into a liquid and producing the heated air 111. A first portion 158 of the liquid refrigerant exiting the heat exchanger 103 may be routed through a first valve 160, such as an electronic expansion valve. The first valve 160 may function as a metering valve and/or as an expansion device. For example, the first valve 160 may regulate the amount of liquid refrigerant and reduce the pressure of the liquid refrigerant before it flows to the heat exchanger 62. Once the liquid refrigerant has exited the first valve 160, the liquid refrigerant enters the heat exchanger 62. As the refrigerant flows through the heat exchanger 62 and exchanges heat with air, as directed by the blower 66, the refrigerant increases in temperature and vaporizes. The vaporized refrigerant may then be routed back to the compressor 112, which may increase a pressure of the vaporized refrigerant to start the cycle again.

In some embodiments, a second portion 162 of the liquid refrigerant that is exiting the heat exchanger 103 may be routed through a second valve 164, such as an electronic expansion valve. Similar to the first valve 160, the second valve 164 may function as a metering valve and/or as an expansion device. For example, the second valve 164 may regulate the amount of liquid refrigerant and reduce the pressure of the liquid refrigerant before it flows through. After exiting the second valve 164, the liquid refrigerant is routed to the sub-circuit heat exchanger 113. As described above, the fan 105 forces the heated air 111 across the sub-circuit heat exchanger 113. In this manner, the heated air 111 exchanges heat with the liquid refrigerant, thereby increasing the temperature of the refrigerant and decreasing the temperature of the heated air 111 to produce the cooled air 115. In some embodiments, the liquid refrigerant vaporizes as it passes through the sub-circuit heat exchanger 113.

After exiting the sub-circuit heat exchanger 113 with an increased temperature, the (heated) refrigerant may pass through the thermoelectric module 150. As the refrigerant passes through the thermoelectric module 150, the thermoelectric module 150 may convert some portion of the thermal energy of the refrigerant to electrical energy. Particularly, in some embodiments, the refrigerant may create a temperature gradient within the thermoelectric module 150, thereby producing a voltage, for example, through the Seebeck effect. In some embodiments, the sub-circuit refrigerant loop 153 may utilize other devices to convert thermal energy of the refrigerant to electrical energy. The voltage produced via the thermoelectric module 150 may be routed to the storage unit 152, such as a battery, capacitor bank, or other electrical energy storage device. Utilizing the electrical energy from the thermoelectric module 150, the storage unit 152 may be utilized to power various components of the refrigerant system 155. For example, the storage unit 152 may be used to power the compressor 112, the first valve 160, the second valve 164, the fan 105, or any combination thereof. In some embodiments, the controller 123 may receive some power from the storage unit 152.

Among other things, the controller 123 may be communicatively coupled and used to control the first valve 160, the second valve 164, the compressor 112, the fan 105, the thermoelectric module 150, the storage unit 152, or any combination thereof. To that end, the controller 123 may include a processor 182, a memory 184, and executable code. The processor 182 may be any general purpose or application-specific processor. The memory 184 may include one or more tangible, non-transitory, machine-readable media. By way of example, such machine-readable media can include RAM, ROM, EPROM, EEPROM, CD-ROM, or other optical disk storage, magnetic disk storage or other magnetic storage devices, or any other medium which can be used to carry or store desired program code in the form of machine-executable instructions or data structures and which can be accessed by a processor, such as the processor 182, or by any general purpose or special purpose computer or other machine with a processor.

Overall, the controller 123 may control the first or second valves 160, 164, such that the refrigerant is substantially, or completely, evaporated and in a gaseous state before flowing to the compressor 112. More particularly, the controller 123 may send one or more metering signals to the first and second valves 160, 164 to meter or otherwise control the flow of the first and second portions 158, 162 based on the data from one or more sensors 186. The one or more sensors 186 may be any suitable pressure sensor and/or temperature sensor that measures pressure and/or temperature of a fluid within the refrigerant system 155. For example, sensors 186 may be configured to measure a variety of parameters of the refrigerant as it flows through the refrigerant system 155, including an internal pressure at the sub-circuit heat exchanger 113, an outlet temperature at the sub-circuit heat exchanger 113, an outlet temperature at the thermoelectric module 150, an internal pressure at the heat exchanger 62, an outlet temperature at the heat exchanger 62, or any combination thereof.

To ensure that the refrigerant is substantially, or completely, evaporated before reaching the compressor 112 as mentioned above, the controller 123 may ensure that a calculated superheat of the refrigerant at the outlets of the sub-circuit heat exchanger 113, the heat exchanger 62, and/or the thermoelectric module 150 matches or meets a predetermined superheat. A superheat may be defined by the excess of temperature of a fluid above its saturation temperature (e.g., boiling point). In other words, the superheat is the increase in temperature after a fluid has fully evaporated. More specifically, to determine the calculated superheat of the refrigerant, the one or more sensors 186 may measure the pressure and temperature of the refrigerant. The temperature may be measured at the outlets of the sub-circuit heat exchanger 113, the thermoelectric module 150, and/or the heat exchanger 62, and the pressure may be measured within the sub-circuit heat exchanger 113, the thermoelectric module 150, and/or the heat exchanger 62. Utilizing the pressure measurements, the controller 123 may determine the saturation temperature of the refrigerant. For example, in some embodiments, the controller 123 may utilize a look-up table stored in the memory 184 that relates pressures to saturation temperatures of the refrigerant. In some embodiments, the controller 123 may calculate the saturation temperature from the pressure of the refrigerant. The controller 123 may then determine the calculated superheat temperature by finding the difference between the temperature and the saturation temperature.

Therefore, to adjust the calculated superheat to the predetermined superheat, the controller 123 may adjust the flow of the refrigerant through a valve, such as the first or second valve 160, 164. For example, if the controller 123 determines that the calculated superheat is less than the predetermined superheat, the controller may decrease the flow of refrigerant through the valve, thus decreasing the pressure of the refrigerant downstream of the valve. As the pressure of the refrigerant decreases, the saturation temperature also decreases, thereby increasing the calculated superheat by increasing the difference between the saturation temperature and the outlet temperature. The converse is also true. For example, if the controller 123 determines that the measured superheat is greater than the predetermined superheat, the controller may increase flow of the refrigerant through the valve, thus increasing the pressure of the refrigerant downstream of the valve. As the pressure of the refrigerant increases, the saturation temperature also increases, thereby decreasing the calculated superheat by decreasing the difference between the saturation temperature and the outlet temperature.

In some embodiments, the controller 123 may adjust the temperature of the second portion 162 of refrigerant such that the temperature of the second portion 162 substantially matches the temperature of the first portion 158 of refrigerant before the first and second portions 158, 162 mix and enter the compressor 112. Accordingly, in some embodiments, the controller 123 may adjust the temperature of the second portion 162 by controlling the amount of thermal energy that the thermoelectric module 150 absorbs from the second portion 162 of refrigerant. Adjustment of thermal energy absorption of the thermoelectric module 150 may be accomplished in multiple ways. As an example, in some embodiments, the controller 123 may control flow of the second portion 162 of refrigerant via a third valve 190 such that the thermoelectric module 150 only absorbs thermal energy from a portion of the second portion 162 of refrigerant. In some embodiments, a position of the thermoelectric module 150 may be adjusted such that more or less thermal energy is absorbed from the second portion 162 of the refrigerant.

Figure 7:
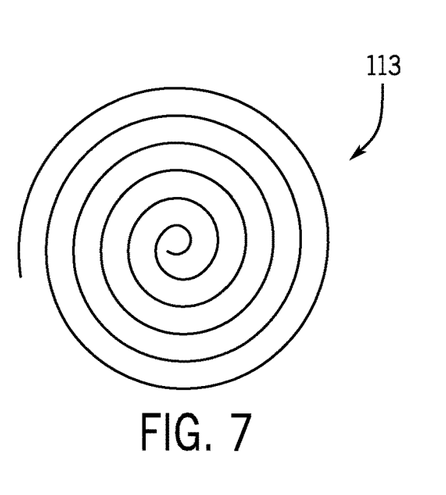
FIG. 7 is a schematic view of the sub-circuit heat exchanger of FIG. 5, in accordance with an embodiment of the present disclosure.
Figure 8:
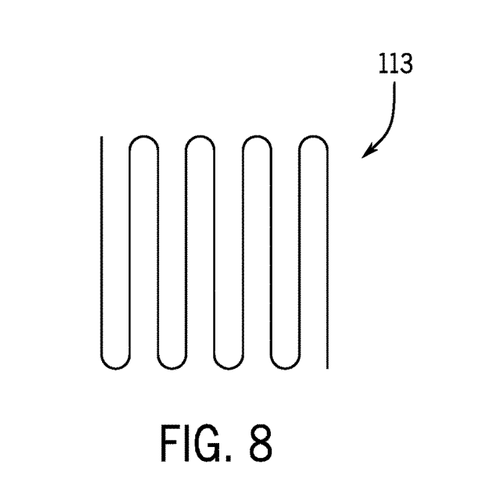
FIG. 8 is a schematic view of the sub-circuit heat exchanger of FIG. 5, in accordance with an embodiment of the present disclosure.

FIGS. 7 and 8 illustrate embodiments of the sub-circuit heat exchanger 113. As mentioned above, the sub-circuit heat exchanger 113 may be disposed between the fan 105 and the fan guard 107 (as seen in FIG. 5). Accordingly, to promote air flow through the top of the outdoor unit 99 and minimize pressure losses, the sub-circuit heat exchanger 113 may substantially match the shape of the fan guard 107. For example, as seen in FIG. 5, if the fan guard 107 is substantially circular, spiral-shaped, etc., the sub-circuit heat exchanger 113 may also be substantially circular, spiral-shaped, etc. as illustrated in FIG. 7. On the other hand, if the fan guard 107 includes substantially rectilinear segments, the sub-circuit heat exchanger may include substantially rectilinear segments as well as illustrated in FIG. 8.

Accordingly, the present disclosure is directed to providing systems and methods to capturing and utilizing waste heat (e.g., air that has been heated after interfacing with a heat exchanger). The waste heat may be utilized to power various elements with an HVAC system. In this manner, the HVAC system may function more efficiently and save on various costs.

While only certain features and embodiments of the present disclosure have been illustrated and described, many modifications and changes may occur to those skilled in the art (e.g., variations in sizes, dimensions, structures, shapes and proportions of the various elements, values of parameters (e.g., temperatures, pressures, etc.), mounting arrangements, use of materials, orientations, etc.) without materially departing from the novel teachings and advantages of the subject matter recited in the claims. The order or sequence of any process or method steps may be varied or re-sequenced according to alternative embodiments. It is, therefore, to be understood that the appended claims are intended to cover all such modifications and changes as fall within the true spirit of the disclosure. Furthermore, in an effort to provide a concise description of the embodiments, all features of an actual implementation may not have been described (i.e., those unrelated to the presently contemplated best mode of carrying out the disclosure, or those unrelated to enabling the claimed features). It should be appreciated that in the development of any such actual implementation, as in any engineering or design project, numerous implementation specific decisions may be made. Such a development effort might be complex and time consuming, but would nevertheless be a routine undertaking of design, fabrication, and manufacture for those of ordinary skill having the benefit of this disclosure, without undue experimentation.

The invention claimed is:

1. A heating, ventilating, and/or air conditioning (HVAC) system having a refrigerant circuit which comprises:
    a compressor configured to compress a refrigerant;
    a condenser configured to receive the refrigerant from the compressor and to condense the refrigerant;
    a valve configured to receive a first portion of the refrigerant from the condenser and to decrease a pressure of the first portion of the refrigerant;
    an evaporator configured to receive the first portion of the refrigerant from the condenser and to evaporate the first portion of the refrigerant; and
    a refrigerant sub-circuit, wherein the refrigerant sub-circuit is configured to receive a second portion of the refrigerant from the condenser and to convert thermal energy of the second portion of the refrigerant to electrical energy.

2. The HVAC system of claim 1, wherein the refrigerant sub-circuit is configured to convert the thermal energy of the second portion of the refrigerant to the electrical energy via a thermoelectric module, and wherein the electrical energy is stored in a storage unit of the HVAC system.

3. The HVAC system of claim 2, comprising a thermoelectric module valve configured to control a flow of the second portion of the refrigerant through the thermoelectric module.

4. The HVAC system of claim 1, wherein the valve is a first valve, and wherein the refrigerant sub-circuit comprises a second valve configured to receive the second portion of the refrigerant from the condenser and to decrease a pressure of the second portion of the refrigerant.

5. The HVAC system of claim 4, wherein the refrigerant sub-circuit comprises a sub-circuit heat exchanger configured to receive the second portion of the refrigerant from the second valve and to evaporate the second portion of the refrigerant.

6. The HVAC system of claim 5, comprising a fan, wherein the fan is configured to draw air across the condenser and to force the air across the sub-circuit heat exchanger.

7. The HVAC system of claim 6, wherein the sub-circuit heat exchanger is disposed between the fan and a fan guard, and wherein the sub-circuit heat exchanger is coupled to the fan guard.

8. The HVAC system of claim 5, comprising a controller and sensors communicatively coupled to the controller, wherein the sensors are configured to measure the pressure of the second portion of the refrigerant within the sub-circuit heat exchanger, and to measure a temperature of the second portion of the refrigerant at an outlet of the sub-circuit heat exchanger, and wherein the controller is configured to adjust a position of the second valve based on the pressure and the temperature of the second portion of the refrigerant.

9. The HVAC system of claim 8, wherein the controller is configured to determine a calculated superheat of the second portion of the refrigerant by determining a saturation temperature of the second portion of the refrigerant based on the pressure of the second portion of the refrigerant and by calculating a difference between the saturation temperature and the temperature of the second portion of the refrigerant at the outlet of the sub-circuit heat exchanger, and wherein the controller is configured to adjust the position of the second valve such that the calculated superheat of the second portion of the refrigerant matches a predetermined superheat.

10. The system of claim 1, wherein the refrigerant circuit is configured to mix the first and second portions of the refrigerant and flow a mixture of the first and second portions of the refrigerant into the compressor.

11. The HVAC system of claim 1, wherein the HVAC system is a split-system HVAC system comprising an outdoor unit and an indoor unit, and wherein the outdoor unit comprises the compressor, the condenser, and the refrigeration sub-circuit.

12. A heating, ventilating, and/or air conditioning (HVAC) system, comprising:
    an outdoor unit configured to receive refrigerant from an indoor unit, the outdoor unit comprising:
        a compressor configured to receive the refrigerant and to increase a pressure of the refrigerant;
        a condenser configured to receive the refrigerant from the compressor and to condense the refrigerant, wherein a first portion of the refrigerant is routed from the condenser to the indoor unit; and
        a sub-circuit heat exchanger configured to receive a second portion of the refrigerant from the condenser, wherein the sub-circuit heat exchanger is disposed between a fan and a fan guard of the outdoor unit, and wherein the fan is configured to force air across the sub-circuit heat exchanger and through the fan guard after drawing the air across the condenser.

13. The HVAC system of claim 12, wherein a shape of the sub-circuit heat exchanger is similar to a shape of the fan guard.

14. The HVAC system of claim 12, wherein the outdoor unit comprises a shroud disposed about a perimeter of the outdoor unit, wherein the condenser is disposed within an interior of the shroud, and wherein the fan is configured to draw the air through the shroud and across the condenser.

15. The HVAC system of claim 12, wherein the outdoor unit comprises a thermoelectric module, wherein the sub-circuit heat exchanger is configured to increase a temperature of the second portion of the refrigerant, wherein the thermoelectric module is disposed beneath the fan and is configured to receive the second portion of the refrigerant from the sub-circuit heat exchanger, and wherein the thermoelectric module is configured to convert a portion of thermal energy of the second portion of refrigerant to electrical energy.

16. The HVAC system of claim 15, wherein the thermoelectric module is configured to store the electrical energy in a storage unit, and wherein the storage unit is disposed within a water-shielded area of the outdoor unit.

17. The HVAC system of claim 16, wherein the storage unit is a capacitor bank or a battery.

18. The HVAC system of claim 16, wherein the electrical energy is utilized to at least partially power the fan and/or a controller of the outdoor unit.

19. The HVAC system of claim 12, wherein the outdoor unit comprises a cover and a base pan, wherein the fan is coupled to the cover at a top of the outdoor unit and the condenser is disposed above the base pan, and wherein a thermoelectric module is disposed directly adjacent and beneath the cover, or the thermoelectric module is disposed directly adjacent and above the base pan.

20. A method of capturing heat in a heating, ventilating, and/or air conditioning (HVAC) system, comprising:
dividing a flow of a refrigerant exiting a condenser into a first portion and a second portion;
flowing the first portion of the flow of the refrigerant through a first refrigerant circuit, wherein the first refrigerant circuit comprises a compressor, the condenser, a first valve, and an evaporator;
flowing the second portion of the flow of the refrigerant through a second refrigerant circuit, wherein the second refrigerant circuit comprises the compressor, the condenser, a second valve, a sub-circuit heat exchanger, and a thermoelectric module; and
converting thermal energy of the second portion of the flow of the refrigerant into electrical energy with the thermoelectric module.

21. The method of claim 20, comprising drawing air across the condenser with a fan and subsequently forcing the air across the sub-circuit heat exchanger with the fan.

22. The method of claim 20, comprising storing the electrical energy in an electrical storage unit, wherein the electrical storage unit comprises a battery or a capacitor.

23. The method of claim 22, comprising powering a component of the HVAC system with the electrical energy stored in the electrical storage unit.

24. The method of claim 20, wherein the second refrigerant circuit is disposed within an outdoor unit of a split refrigerant system.

* * * * *